United States Patent
Chen et al.

(10) Patent No.: US 12,300,576 B2
(45) Date of Patent: May 13, 2025

(54) CYCLIC COOLING EMBEDDED PACKAGING SUBSTRATE AND MANUFACTURING METHOD THEREOF

(71) Applicant: Zhuhai ACCESS Semiconductor Co., Ltd., Guangdong (CN)

(72) Inventors: Xianming Chen, Guangdong (CN); Yejie Hong, Guangdong (CN); Benxia Huang, Guangdong (CN); Lei Feng, Guangdong (CN)

(73) Assignee: Zhuhai ACCESS Semiconductor Co., Ltd., Guangdong (CN)

( * ) Notice: Subject to any disclaimer, the term of this patent is extended or adjusted under 35 U.S.C. 154(b) by 345 days.

(21) Appl. No.: 17/664,417

(22) Filed: May 22, 2022

(65) Prior Publication Data
US 2023/0010115 A1    Jan. 12, 2023

(30) Foreign Application Priority Data
Jul. 6, 2021  (CN) .......................... 202110763517.6

(51) Int. Cl.
*H01L 21/48* (2006.01)
*H01L 21/52* (2006.01)
*H01L 23/13* (2006.01)
*H01L 23/367* (2006.01)
(Continued)

(52) U.S. Cl.
CPC .......... *H01L 23/46* (2013.01); *H01L 21/4878* (2013.01)

(58) Field of Classification Search
CPC . H01L 23/46; H01L 21/4878; H01L 21/4857; H01L 23/473; H01L 23/49822;
(Continued)

(56) References Cited

U.S. PATENT DOCUMENTS

2004/0095727 A1    5/2004   Houle
2019/0385925 A1*  12/2019   Walczyk ............. H01L 23/3677

FOREIGN PATENT DOCUMENTS

CN    109524373 A    3/2019
CN    112164677 A    1/2021
(Continued)

OTHER PUBLICATIONS

Office Action of Chinese Patent Application No. 202110763517.6, dated May 31, 2022, 36 pages with translations.
(Continued)

*Primary Examiner* — Christine S. Kim
*Assistant Examiner* — Sesha Sairaman Srinivasan
(74) *Attorney, Agent, or Firm* — Buchalter; Jason W. Croft

(57) ABSTRACT

A cyclic cooling embedded packaging substrate and a manufacturing method thereof are disclosed. The packaging substrate includes a dielectric material body, a chip, a first metal face, a second metal face and a first trace. The dielectric material body is provided with a packaging cavity, the chip is packaged in the packaging cavity, the first metal face is embedded in the dielectric material body, covers and is connected to a heat dissipation face of the chip. The second metal face is embedded in the dielectric material body, connected to a surface of the first metal face, and is provided with a first cooling channel pattern for forming a cooling channel. The first trace is arranged on a surface of the dielectric material body or embedded therein, and is connected with a corresponding terminal on an active face of the chip through a first conductive structure.

8 Claims, 12 Drawing Sheets

(51) Int. Cl.
*H01L 23/373* (2006.01)
*H01L 23/46* (2006.01)
*H01L 23/473* (2006.01)
*H01L 23/498* (2006.01)
*H01L 23/538* (2006.01)

(58) Field of Classification Search
CPC .............. H01L 23/5389; H01L 24/19; H01L 2224/04105; H01L 2224/32245; H01L 2224/73267; H01L 23/3736; H01L 21/4882; H01L 23/367; H01L 23/13; H01L 21/486; H01L 21/52; H01L 23/3677; H01L 23/49827; H01L 23/49838
See application file for complete search history.

(56) References Cited

FOREIGN PATENT DOCUMENTS

| | | |
|---|---|---|
| JP | 2002315357 A | 10/2002 |
| JP | 2004241660 A | 8/2004 |
| JP | 2005123317 A | 5/2005 |
| JP | 2021509777 T | 4/2021 |
| KR | 20090129208 A | 12/2009 |
| TW | 201715666 A | 5/2017 |
| WO | 2019073801 A1 | 4/2019 |

OTHER PUBLICATIONS

Office Action of Chinese Patent Application No. 202110763517.6, dated Apr. 11, 2022, 60 pages with translations.
Office Action of Chinese Patent Application No. 202110763517.6, dated Jan. 29, 2022, 32 pages with translations.
Office Action of Japanese Patent Application No. 2022-081713, dated Apr. 17, 2023, 17 pages with translations.
Office Action of Taiwanese Patent Application No. 11220398230, dated Apr. 28, 2023, 22 pages with translations.
Office Action of Taiwanese Patent Application No. 11320281960, dated Mar. 22, 2024, 22 pages with translations.
Office Action of Taiwanese Patent Application No. 11221158380, dated Nov. 21, 2023, 18 pages with translations.

\* cited by examiner

CYCLIC COOLING EMBEDDED PACKAGING SUBSTRATE AND MANUFACTURING METHOD THEREOF

CROSS-REFERENCE TO RELATED APPLICATION

This application is based on and claims the benefit of priority from Chinese Patent Application No. 2021107635176, filed on 6 Jul. 2021, the entirety of which is incorporated by reference herein.

TECHNICAL FIELD

The disclosure relates to the technical field of semiconductor packaging, and more particularly, to a cyclic cooling embedded packaging substrate and a manufacturing method thereof.

BACKGROUND

With the development and progress of electronic technology, electronic products are becoming smaller and thinner, and functions of the electronic products are required to be more powerful, which promotes packaging structures of the electronic products to develop towards high integration and miniaturization, and embedded packaging of a chip and other components emerges at the right moment. Meanwhile, application of electronic components is also developing towards high frequency, high speed and high power, resulting in the rapid increase of heat flux per unit area.

With the increase of working environment temperature, the electronic components have a decreased running speed, and an increased loss. Meanwhile, reliability of the electronic products is relatively reduced when running in a high temperature environment for a long time. Therefore, if heat generated by the electronic components with high frequency, high speed and high power cannot be dissipated in time, performance and reliability of the electronic products may be affected. Therefore, under the trend of high frequency, high speed and high power, techniques to optimize designs of an embedded packaging substrate and a packaging body and to improve heat dissipation performance of an embedded packaging structure are desirable.

SUMMARY

The disclosure aims to solve various technical problems in the prior art. Therefore, the disclosure provides a cyclic cooling embedded packaging substrate and a manufacturing method thereof, which can improve heat dissipation performance of an embedded packaging substrate.

In a first aspect, a cyclic cooling embedded packaging substrate according to an embodiment of the disclosure includes: a dielectric material body provided with a packaging cavity; a chip provided with a heat dissipation face and an active face, where the chip is packaged in the packaging cavity; a first metal face arranged in the dielectric material body, where the first metal face covers and is connected to the heat dissipation face of the chip; a second metal face arranged on a surface of the first metal face, where the second metal face is provided with a first cooling channel pattern for forming a cooling channel; and a first trace arranged on a surface of the dielectric material body or arranged in the dielectric material body, where the first trace is connected with a corresponding terminal on the active face of the chip through a first conductive structure.

The cyclic cooling embedded packaging substrate according to an embodiment of the disclosure at least has the following beneficial effects.

According to an embodiment of the disclosure, the first metal face and the second metal face are arranged on the heat dissipation face of the chip, so that the cooling channel is formed, thus being beneficial for improving heat dissipation performance. Moreover, the cooling channel can be formed during machining of the packaging substrate, so that machining steps are simple, thus being beneficial for reducing production costs.

According to some embodiments of the disclosure, an interlayer conductive structure is arranged in the dielectric material body, and the first trace is connected with a second trace of an adjacent layer through the interlayer conductive structure.

According to some embodiments of the disclosure, the cyclic cooling embedded packaging substrate further includes a third metal face which is connected with the second metal face and covers the first cooling channel pattern, where the third metal face is provided with a first opening and a second opening communicated with the cooling channel.

According to some embodiments of the disclosure, the third metal face is provided with a second cooling channel pattern, and the second cooling channel pattern is adapted to the first cooling channel pattern.

According to some embodiments of the disclosure, a surface of the second metal face is provided with a first metal surface processing layer.

According to some embodiments of the disclosure, a surface of the third metal face is provided with a second metal surface processing layer.

In a second aspect, a cyclic cooling embedded packaging substrate according to an embodiment of the disclosure includes: a dielectric material body provided with a packaging cavity; a chip provided with a heat dissipation face and an active face, where the chip is packaged in the packaging cavity; a first metal face which is arranged in the dielectric material body and covers the heat dissipation face of the chip; a heat conductive metal face connected between the first metal face and the heat dissipation face of the chip, where an area of the heat conductive metal face is less than or equal to an area of the first metal face; a second metal face arranged on a surface of the first metal face, where the second metal face is provided with a first cooling channel pattern for forming a cooling channel; and a first trace arranged on a surface of the dielectric material body or arranged in the dielectric material body, where the first trace is connected with a corresponding terminal on the active face of the chip.

The cyclic cooling embedded packaging substrate according to an embodiment of the disclosure at least has the following beneficial effects.

According to an embodiment of the disclosure, the first metal face and the second metal face are arranged on the heat dissipation face of the chip, so that the cooling channel is formed, thus being beneficial for improving heat dissipation performance. Moreover, the cooling channel can be formed during machining of the packaging substrate, so that machining steps are simple, thus being beneficial for reducing production costs.

According to some embodiments of the disclosure, an interlayer conductive structure is arranged in the dielectric material body, and the first trace is connected with a second trace of an adjacent layer through the interlayer conductive structure.

According to some embodiments of the disclosure, the cyclic cooling embedded packaging substrate further includes a third metal face which is connected with the second metal face and covers the first cooling channel pattern, where the third metal face is provided with a first opening and a second opening communicated with the cooling channel.

According to some embodiments of the disclosure, the third metal face is provided with a second cooling channel pattern, and the second cooling channel pattern is adapted to the first cooling channel pattern.

In a third aspect, a manufacturing method of a cyclic cooling embedded packaging substrate according to an embodiment of the disclosure includes:

providing a supporting frame used as a first dielectric layer, where the supporting frame is provided with a packaging cavity, and provided with a first face and a second face which are opposite;

providing a temporary bearing face on a bottom portion of the packaging cavity, attaching a to-be-packaged chip in the packaging cavity, a heat dissipation face of the chip being in contact connection with the temporary bearing face;

after packaging the chip with a packaging material, machining a first through hole in the packaging material, the first through hole being communicated with a corresponding terminal on an active face of the chip;

removing the temporary bearing face;

machining a first conductive structure in the first through hole, and machining a first circuit layer and a second circuit layer on the first face and the second face of the supporting frame respectively, where the first circuit layer is provided with a first trace connected with the first conductive structure, and the second circuit layer is provided with a first metal face which covers and is connected to the heat dissipation face of the chip; and machining a second metal face on the first metal face, where the second metal face is provided with a first cooling channel pattern for forming a cooling channel.

The manufacturing method of a cyclic cooling embedded packaging substrate according to an embodiment of the disclosure at least has the following beneficial effects.

According to an embodiment of the disclosure, the first metal face and the second metal face are machined on the heat dissipation face of the chip, so that the cooling channel is formed, thus being beneficial for improving heat dissipation performance. Moreover, the cooling channel can be formed during machining of the packaging substrate, so that machining steps are simple, thus being beneficial for reducing production costs.

According to some embodiments of the disclosure, the supporting frame is provided with a first through hole post used as an interlayer conductive structure, the second circuit layer is further provided with a first functional circuit, a first end of the first through hole post is connected with the first trace, and a second end of the first through hole post is connected with the first functional circuit.

According to some embodiments of the disclosure, the manufacturing method of a cyclic cooling embedded packaging substrate further includes:

manufacturing a second dielectric layer on the second face of the supporting frame, and forming a window in a first region and a second region of the second dielectric layer respectively, where the first region corresponds to the first cooling channel pattern, and the second region corresponds to at least one of the first through hole post or the first functional circuit;

machining a first via hole used as an interlayer conductive structure in the second region; and machining a second functional circuit on a surface of the second dielectric layer, the second functional circuit being connected with the first via hole.

According to some embodiments of the disclosure, the manufacturing method of a cyclic cooling embedded packaging substrate further includes:

manufacturing a third dielectric layer on the first face of the supporting frame;

machining a second via hole used as an interlayer conductive structure on the third dielectric layer, the second via hole being connected with the first trace; and machining a third functional circuit on a surface of the third dielectric layer, the third functional circuit being connected with the second via hole.

According to some embodiments of the disclosure, the manufacturing method of a cyclic cooling embedded packaging substrate further includes: machining a first metal surface processing layer on the first cooling channel pattern.

According to some embodiments of the disclosure, the manufacturing method of a cyclic cooling embedded packaging substrate further includes:

providing a metal base material;

machining a second cooling channel pattern on the metal base material, where the second cooling channel pattern is adapted to the first cooling channel pattern;

machining a first opening used as an inlet of the cooling channel and a second opening used as an outlet of the cooling channel on the metal base material; and covering and connecting the metal base material machined with the second cooling channel pattern to the first cooling channel pattern.

According to some embodiments of the disclosure, before covering and connecting the metal base material machined with the second cooling channel pattern to the first cooling channel pattern, the method further includes:

machining a second metal surface processing layer on the metal base material and the second cooling channel pattern.

In a fourth aspect, a manufacturing method of a cyclic cooling embedded packaging substrate according to an embodiment of the disclosure includes:

providing a supporting frame used as a first dielectric layer, where the supporting frame is provided with a packaging cavity, and provided with a first face and a second face which are opposite;

providing a temporary bearing face on a bottom portion of the packaging cavity, attaching a to-be-packaged chip in the packaging cavity, an active face of the chip being in contact connection with the temporary bearing face;

after packaging the chip with a packaging material, machining a first windowing position on the packaging material, the first windowing position corresponding to a heat dissipation face of the chip;

machining a heat conductive metal face in the first windowing position;

removing the temporary bearing face;

machining a first circuit layer on the second face of the supporting frame, and machining a second circuit layer on the first face of the supporting frame, where the second circuit layer is provided with a first metal face which covers and is connected to the heat conductive metal face, the first circuit layer is provided with a first trace, and the first trace is connected to a corresponding terminal on the active face of the chip; and machining a second metal face on the first metal face, where the second metal face is provided with a first cooling channel pattern for forming a cooling channel.

The cyclic cooling embedded packaging substrate according to an embodiment of the disclosure at least has the following beneficial effects.

According to an embodiment of the disclosure, the first metal face and the second metal face are machined on the heat dissipation face of the chip, so that the cooling channel is formed, thus being beneficial for improving heat dissipation performance. Moreover, the cooling channel can be formed during machining of the packaging substrate, so that machining steps are simple, thus being beneficial for reducing production costs.

According to some embodiments of the disclosure, the manufacturing method of a cyclic cooling embedded packaging substrate further includes:

providing a metal base material;

machining a second cooling channel pattern on the metal base material, where the second cooling channel pattern is adapted to the first cooling channel pattern;

machining a first opening used as an inlet of the cooling channel and a second opening used as an outlet of the cooling channel on the metal base material; and covering and connecting the metal base material machined with the second cooling channel pattern to the first cooling channel pattern.

In a fifth aspect, a cyclic cooling embedded packaging substrate according to an embodiment of the disclosure is manufactured by the manufacturing method of a cyclic cooling embedded packaging substrate above.

Additional aspects and advantages of the disclosure will be explained in part in the following description, which can become apparent from the following description or be understood through practice of the disclosure.

BRIEF DESCRIPTION OF THE DRAWINGS

The above and/or additional aspects and advantages of the disclosure will be apparent and easily understood from the descriptions of the embodiments with reference to the following drawings, where.

DETAILED DESCRIPTION

Figure 1:
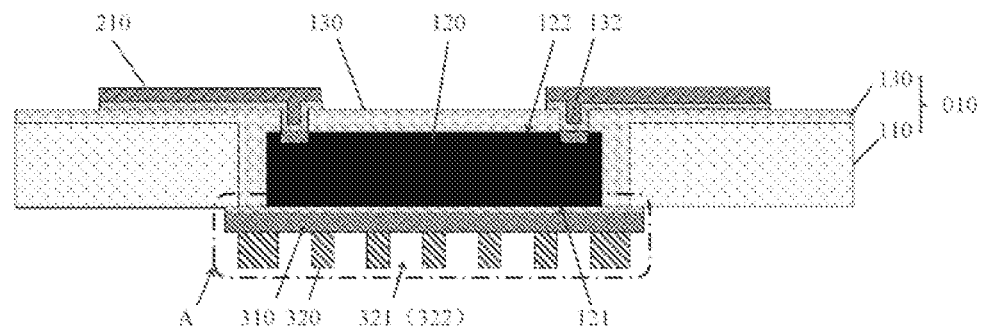
FIG. 1 is a first schematic diagram of a cyclic cooling embedded packaging substrate according to an embodiment of the disclosure.

The embodiments of the disclosure are described below in detail. Examples of the embodiments are shown in the accompanying drawings. The same or similar numerals represent the same or similar elements or elements having the same or similar functions throughout the specification. The embodiments described below with reference to the accompanying drawings are exemplary, and are only used to explain the disclosure but should not be construed as a limitation to the disclosure.

In the description of the disclosure, it should be understood that the positional descriptions referred to, for example, the directional or positional relationships indicated by up, down, front, rear, left, right, etc., are based on the directional or positional relationships shown in the drawings, and are only for convenience and simplification of description of the disclosure, but not for indicating or implying that the referred device or element must have a specific direction, be constructed and operated in a specific direction, and thus should not be construed as limiting the disclosure.

In the description of the disclosure, "several" means one or more, "a plurality of" means more than two, "greater than a number", "less than a number", "exceed a number" and the like indicate that the number is excluded, and "above a number", "below a number", "within a number", and the like indicate that the number is included. "First" and "second" if described are only used to distinguish between technical features but cannot be used to indicate or imply relative importance or implicitly specify a quantity of indicated technical features or implicitly specify a sequential relationship of indicated technical features.

In the description of the disclosure, unless otherwise expressly defined, the terms such as "disposed", "mounted", and "connected" should be understood in a broad sense. For persons of ordinary skill in the art, specific meanings of the terms in the disclosure may be appropriately determined with reference to the specific content in the technical solution.

In the description of the embodiments of the disclosure, the method steps are continuously labeled for convenience of examination and understanding. In combination with the overall technical solutions of the disclosure and the logical relationships among the steps, adjustments of implementation sequences among the steps do not affect the technical effects achieved by the technical solutions of the disclosure. Some manufacturing steps involved in the embodiments, such as seed layer processing, pattern transfer and pattern electroplating, are not described in detail herein, as materials and process flows in these steps are all common knowledge in the art. In fact, when designing corresponding steps for a specific product, those skilled in the art can make appropriate choices from various alternative materials and manufacturing flows based on clear understanding of parameters such as production batch, substrate complexity and component resolution.

Example Embodiment 1

Figure 2:
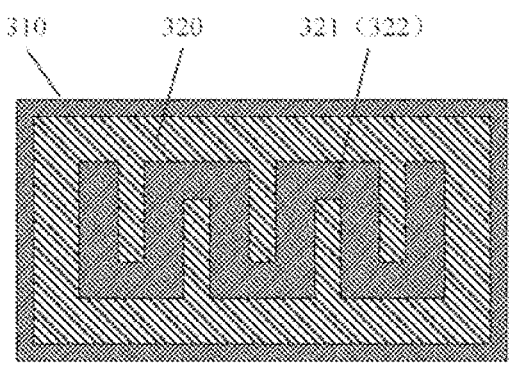
FIG. 2 is a bottom view of a marked position A in FIG. 1.
Figure 3:
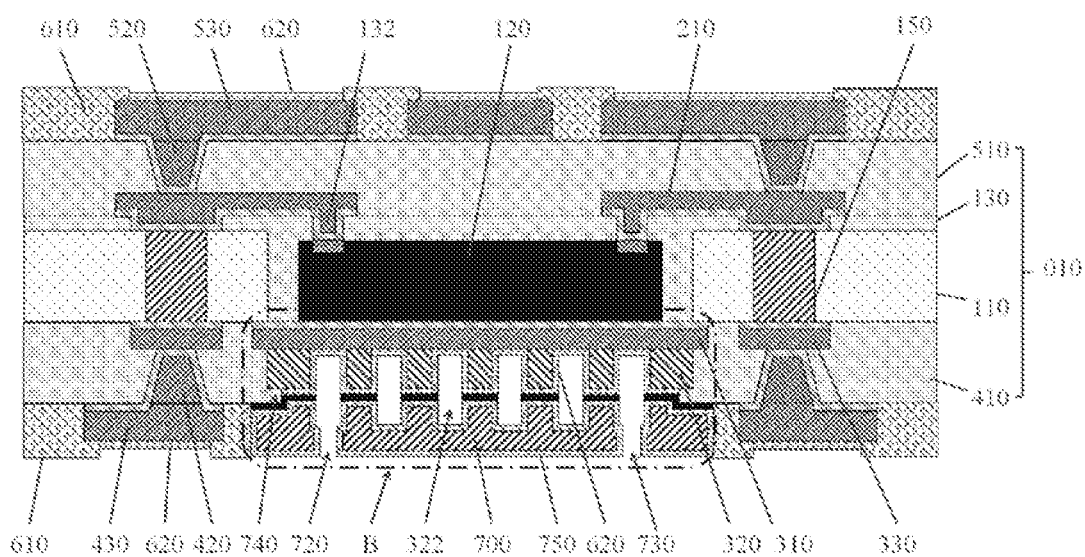
FIG. 3 is a second schematic diagram of the cyclic cooling embedded packaging substrate according to an embodiment of the disclosure.

With reference to FIG. 1, the embodiment discloses a cyclic cooling embedded packaging substrate, which includes a dielectric material body 010, a chip 120, a first metal face 310, a second metal face 320 and a first trace 210. The dielectric material body 010 is provided with a packaging cavity 101 (with reference to FIG. 7 or FIG. 8). The chip 120 is packaged in the packaging cavity 101, the chip 120 is provided with a heat dissipation face 121 and an active face 122, and a plurality of terminals for exchanging signals with the outside are arranged on the active face 122 of the chip 120. The first metal face 310 is arranged in the dielectric material body 010, and the first metal face 310 covers and is connected to the heat dissipation face 121 of the chip 120. The second metal face 320 is arranged on a surface of the first metal face 310, and the second metal face 320 is provided with a first cooling channel pattern 321 for forming a cooling channel 322. The first cooling channel pattern 321 may be set as a corresponding shape according to actual means of production, such as a comb pattern or a serpentine pattern as shown in FIG. 2. According to different numbers of layers of the dielectric material body 010, the first trace 210 is arranged on a surface of the dielectric material body 010 or arranged in the dielectric material body 010. For example, as shown in FIG. 1, in the case that the first trace 210 is used as an outer layer circuit, the first trace 210 is arranged on the surface of the dielectric material body 010. For another example, as shown in FIG. 3, in the case that the first trace 210 is used as an inner layer circuit, the first trace 210 is arranged in the dielectric material body 010. The first trace 210 is connected with a corresponding terminal on the active face 122 of the chip 120 through a first conductive structure 132, so that a signal of the chip 120 may be transmitted through the first trace 210, where the first conductive structure 132 may be a through hole post, a via hole, a laser filling hole or a buried hole. It should be noted that, according to different numbers of layers formed and different materials used, the dielectric material body 010 is different in composition. For example, the dielectric material body 010 shown in FIG. 1 includes a polymer material on a first dielectric layer 110 and a packaging material 130 for packaging the chip 120, and the packaging material 130 may be a photosensitive material. For another example, the dielectric material body 010 shown in FIG. 3 includes the polymer material as the first dielectric layer 110, a first photosensitive insulating material as a second dielectric layer 410, a second photosensitive insulating material as a third dielectric layer 510, and the packaging material 130 for packaging the chip 120, and the packaging material 130 may be the photosensitive material.

According to an embodiment of the disclosure, the first metal face 310 and the second metal face 320 are arranged on the heat dissipation face 121 of the chip 120, so that the cooling channel 322 is formed, thus being beneficial for improving heat dissipation performance. Moreover, the cooling channel 322 can be formed during machining of the packaging substrate, so that machining steps are simple, thus being beneficial for reducing production costs.

In order to realize signal transmission between different layers, an interlayer conductive structure is arranged in the dielectric material body 010, and the first trace 210 is connected with a second trace of an adjacent layer through the interlayer conductive structure. For example, with reference to FIG. 3, the first trace 210 is arranged on a first face of the first dielectric layer 110, and a first through hole post 150 used as an interlayer conductive structure is arranged in the first dielectric layer 110. A second face of the first dielectric layer 110 is provided with a first functional circuit 330 used as the second trace, and two ends of the first through hole post 150 are connected with the first trace 210 and the first functional circuit 330 respectively, so that the first trace 210 is connected with the second trace of the adjacent layer through the interlayer conductive structure. For another example, the first trace 210 is arranged on the first face of the first dielectric layer 110, and a third dielectric layer 510 is also arranged on the first face of the first dielectric layer 110. A second via hole 520 used as an interlayer conductive structure and a third functional circuit 530 used as the second trace are arranged on the third dielectric layer 510, and two ends of the second via hole 520 are connected with the first trace 210 and the third functional circuit 530 respectively, so that the first trace 210 is connected with the second trace of the adjacent layer through the interlayer conductive structure.

Figure 4:
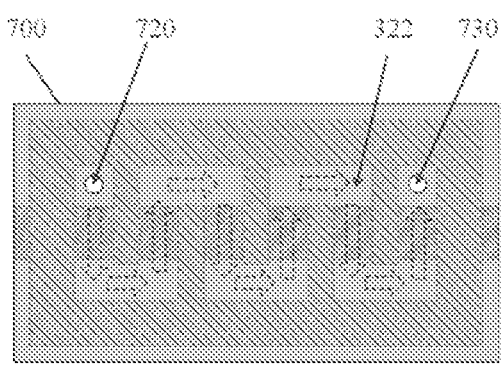
FIG. 4 is a bottom view of a marked position B in FIG. 3.

With reference to FIG. 4, the cyclic cooling embedded packaging substrate according to an embodiment of the disclosure further includes a third metal face 700 which is connected with the second metal face 320 and covers the first cooling channel pattern 321, where the third metal face 700 is provided with a first opening 720 and a second opening 730 communicated with the cooling channel 322. After the third metal face 700 covers the second metal face 320, the relatively closed cooling channel 322 may be formed. When in use, a coolant may be pumped into the cooling channel 322 by an external hydraulic pump, which can quickly take away heat generated by the chip 120 during running, thus greatly improving heat dissipation performance. The first opening 720 is used as an inlet of the cooling channel 322, and the second opening 730 is used as an outlet of the cooling channel 322. The first opening 720 and the second opening 730 may both be through holes or notch grooves.

It is worth understanding that, the third metal face 700 may be a metal board with a flat surface. In addition, in order to increase an inner space of the cooling channel 322, the third metal face 700 may be further provided with a second cooling channel pattern 702, and the second cooling channel pattern 702 is adapted to the first cooling channel pattern 321. For example, with reference to FIG. 3, the first cooling channel pattern 321 and the second cooling channel pattern are both serpentine patterns with the same size. Assuming that the first cooling channel pattern 321 and the second cooling channel pattern 702 have a thickness of h, after the two patterns are matched to form the cooling channel 322, the cooling channel 322 has a height of 2*h, which is beneficial for increasing the inner space of the cooling channel 322, and can reduce the thickness of the first cooling channel pattern 321, thus being convenient for pattern electroplating during production and machining.

With reference to FIG. 3, in some examples, an edge of the third metal face 700 may be provided with an avoidance recess 740, the avoidance recess 740 is configured for avoiding the dielectric material body 010 outside the edge of the third metal face 700, so that the third metal face 700 and the second metal face 320 may be tightly connected.

According to an embodiment of the disclosure, the cooling channel 322 may be manufactured by machining process of a circuit board (referring to a manufacturing method in following Embodiment 3 for details). Based on this characteristic, during production, a first metal surface processing layer 620 may be formed on a surface of the second metal face 320, such as antioxidation, electroless nickel electroless palladium immersion gold, tin plating and immersion silver, which means that the surface of the second metal face 320 is provided with the first metal surface processing layer 620, which can protect the second metal face 320, thus being beneficial for improving reliability of products.

Similarly, a surface of the third metal face 700 is provided with a second metal surface processing layer 750, such as antioxidation, electroless nickel electroless palladium immersion gold, tin plating and immersion silver, which can protect the third metal face 700, thus being beneficial for improving a reliability of products.

Example Embodiment 2

Figure 5:
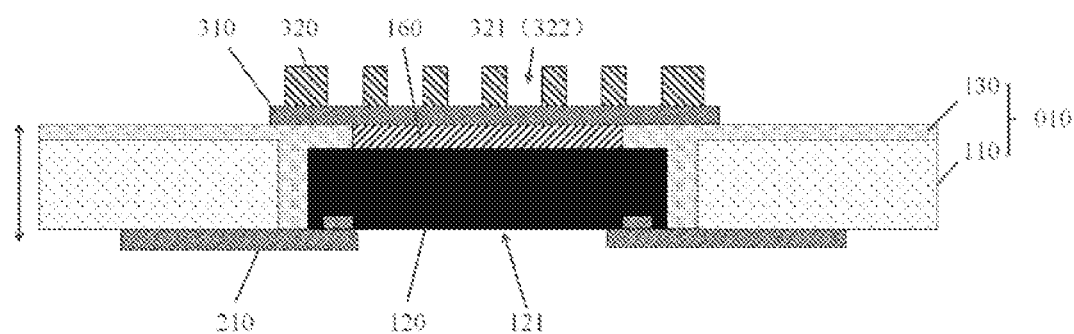
FIG. 5 is a third schematic diagram of the cyclic cooling embedded packaging substrate according to an embodiment of the disclosure.
Figure 6:
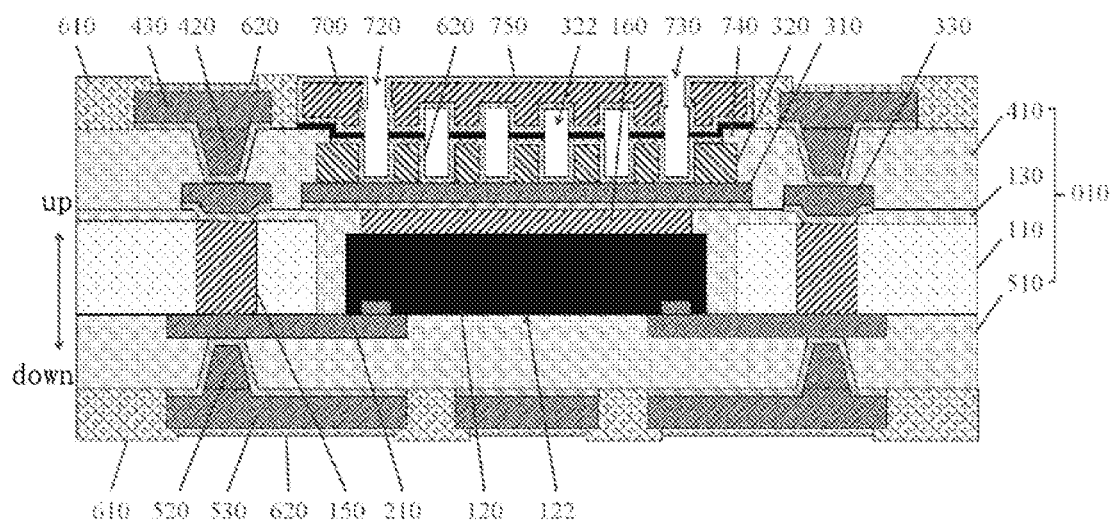
FIG. 6 is a fourth schematic diagram of the cyclic cooling embedded packaging substrate according to an embodiment of the disclosure.

With reference to FIG. 5, the embodiment of the disclosure discloses a cyclic cooling embedded packaging substrate, which includes a dielectric material body 010, a chip 120, a first metal face 310, a heat conductive metal face 160, a second metal face 320 and a first trace 210. The dielectric material body 010 is provided with a packaging cavity 101. The chip 120 is provided with a heat dissipation face 121 and an active face 122, a plurality of terminals for exchanging signals with the outside are arranged on the active face 122 of the chip 120, and the chip 120 is packaged in the packaging cavity 101. The first metal face 310 is embedded in the dielectric material body 010, and covers the heat dissipation face 121 of the chip 120. The heat conductive metal face 160 is connected between the first metal face 310 and the heat dissipation face 121 of the chip 120, and an area of the heat conductive metal face 160 is less than or equal to an area of the first metal face 310. The second metal face 320 is embedded in the dielectric material body 010, and connected to a surface of the first metal face 310, and the second metal face 320 is provided with a first cooling channel pattern 321 for forming a cooling channel 322. The first cooling channel pattern 321 may be set as a corresponding shape according to actual means of production, such as a comb pattern or a serpentine pattern as shown in FIG. 2. According to different numbers of layers of the dielectric material body 010, the first trace 210 is arranged on a surface of the dielectric material body 010 (as shown in FIG. 5) or arranged in the dielectric material body 010 (as shown in FIG. 6), where the first trace 210 is connected with a corresponding terminal on the active face 122 of the chip 120, which may refer to example Embodiment 1 for details to avoid repeated description. Compared with example Embodiment 1, the chip 120 of this embodiment has different orientations. With reference to FIG. 5 or FIG. 6, the active face 122 of the chip 120 is oriented downwardly in the drawing, and the heat dissipation face 121 of the chip 120 is oriented upwardly in the drawing. The terminal on the active face 122 of the chip 120 is directly connected to the corresponding first trace 210, so that the first conductive structure 132 in example Embodiment 1 may be omitted.

In this embodiment of the disclosure, the first metal face 310 and the second metal face 320 are arranged on the heat dissipation face 121 of the chip 120, so that the cooling channel 322 is formed, thus being beneficial for improving heat dissipation performance. Moreover, the cooling channel 322 can be formed during machining of the packaging substrate, so that machining steps are simple, thus being beneficial for reducing production costs.

Similar to Example Embodiment 1, in order to realize signal transmission between different layers, an interlayer conductive structure is arranged in the dielectric material body 010, and the first trace 210 is connected with a second trace of an adjacent layer through the interlayer conductive structure. Examples and technical effect of the interlayer conductive structure refer to example Embodiment 1 to avoid repeated description.

Similar to example Embodiment 1, the cyclic cooling embedded packaging substrate further includes a third metal face 700 which is connected with the second metal face 320 and covers the first cooling channel pattern 321, where the third metal face 700 is provided with a first opening 720 and a second opening 730 communicated with the cooling channel 322. The third metal face 700 is provided with a second cooling channel pattern 702, and the second cooling channel pattern 702 is adapted to the first cooling channel pattern 321. A surface of the second metal face 320 is provided with a first metal surface processing layer 620, and a surface of the third metal face 700 is provided with a second metal surface processing layer 750. Contents not involved in this embodiment refer to example Embodiment 1 to avoid repeated description.

Example Embodiment 3

The embodiment of the disclosure discloses a manufacturing method of a cyclic cooling embedded packaging substrate, which includes steps S310 to S360. All steps of the manufacturing method of a cyclic cooling embedded packaging substrate in this embodiment are described in detail hereinafter.

Figure 7:
FIG. 7 to FIG. 30 are schematic structural diagrams of intermediate processes of a manufacturing method of a cyclic cooling embedded packaging substrate according to example Embodiment 3 of the disclosure.

In step S310, with reference to FIG. 7, a supporting frame 100 used as a first dielectric layer 110 is provided, where the supporting frame 100 is provided with a packaging cavity 101, and provided with a first face and a second face which are opposite. The supporting frame 100 is made of a polymer material, and the polymer material may be FR4, an Ajinomoto Build-up material, polyimide, a prepreg containing a glass fabric, or a combination thereof. It is worth understanding that, one or more packaging cavities 101 may be provided, and for convenience of description, one packaging cavity 101 is taken as an example in the embodiment.

Figure 8:
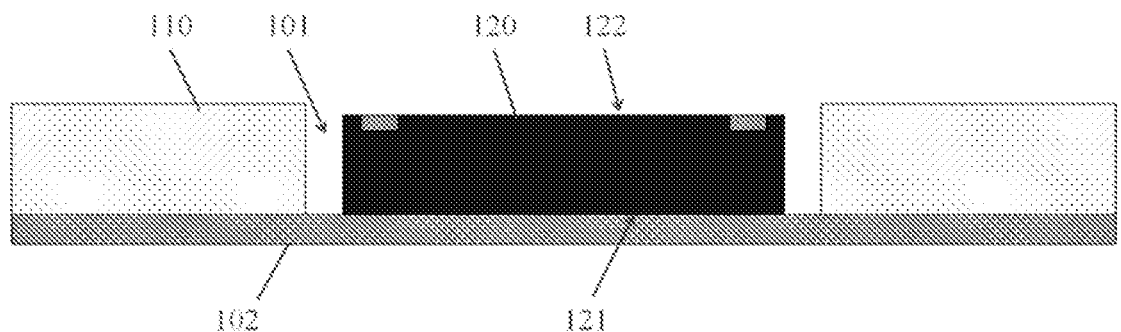

In step S320, with reference to FIG. 8, a temporary bearing face 102 is arranged on a bottom portion of the packaging cavity 101, a to-be-packaged chip 120 is attached in the packaging cavity 101, and a heat dissipation face 121 of the chip 120 is in contact connection with the temporary bearing face 102.

Specifically, since the packaging cavity 101 is an empty cavity penetrating through the first face and the second face of the supporting frame 100, it is necessary to adhere an adhesive tape, an adhesive paper or an adhesive plaster to the second face of the supporting frame 100 before attaching the chip 120, so as to achieve a purpose of providing the temporary bearing face 102 on the bottom portion of the packaging cavity 101. The chip 120 is attached in the packaging cavity 101, and the heat dissipation face 121 of the chip 120 is in contact connection with the temporary bearing face 102, so that the heat dissipation face 121 of the chip 120 may be flush with the second face of the supporting frame 100, thus being convenient for subsequent machining of the first metal face 310.

Figure 9:
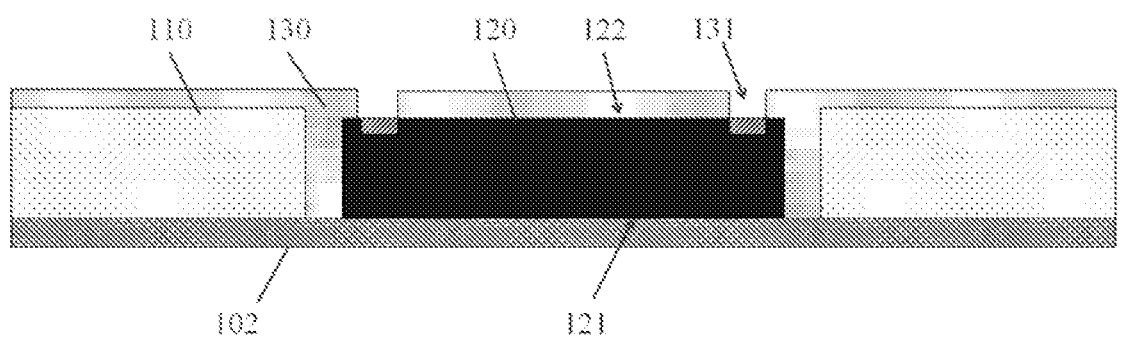

In step S330, with reference to FIG. 9, after packaging the chip 120 with a packaging material 130, a first through hole 131 is machined in the packaging material 130, and the first through hole 131 is communicated with a corresponding terminal on an active face 122 of the chip 120. According to different machining methods, the packaging material 130 may be selected from different materials. For example, in the case that the packaging material 130 in the embodiment is a photosensitive material, after packaging the chip 120, the first through hole 131 is machined by exposure and development. For another example, in the case that the packaging material 130 is a dielectric material (such as the prepreg), the first through hole 131 may be machined by laser drilling.

In step S340, the temporary bearing face 102 is removed, so that the second face of the supporting frame 100 is exposed from the heat dissipation face 121 of the chip 120 to facilitate subsequent machining.

Figure 10:
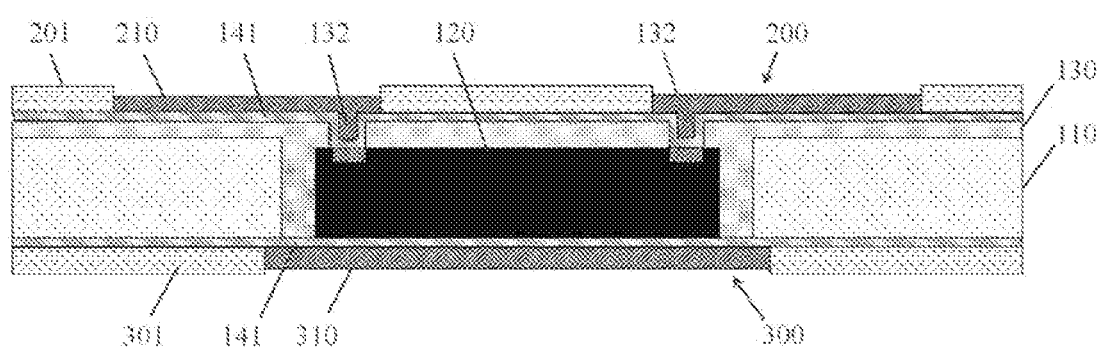

In step S350, with reference to FIG. 10, a first conductive structure 132 is machined in the first through hole 131, and a first circuit layer 200 and a second circuit layer 300 are machined on the first face and the second face of the supporting frame 100 respectively. The first circuit layer 200 is provided with a first trace 210 connected with the first conductive structure 132, and the second circuit layer 300 is provided with a first metal face 310 which covers and is connected to the heat dissipation face 121 of the chip 120.

In the embodiment, the first conductive structure 132, the first circuit layer 200 and the second circuit layer 300 are all obtained by machining using pattern transfer and pattern electroplating. For example, a first photoresist material 201 is applied on the first circuit layer 200, a second photoresist material 301 is applied on the second circuit layer 300, and the first photoresist material 201 and the second photoresist material 301 are exposed and developed to obtain corresponding circuit patterns. According to different technological parameters of actual production, the pattern electroplating may be realized by electroplating once or electroplating for many times. It is worth understanding that, in order to improve a bonding force between electroboardd metal and the supporting frame 100, a first metal seed layer 141 may be electroboardd on the first face and the second face of the supporting frame 100 in advance, and the first metal seed layer 141 is removed after finishing machining.

Figure 11:
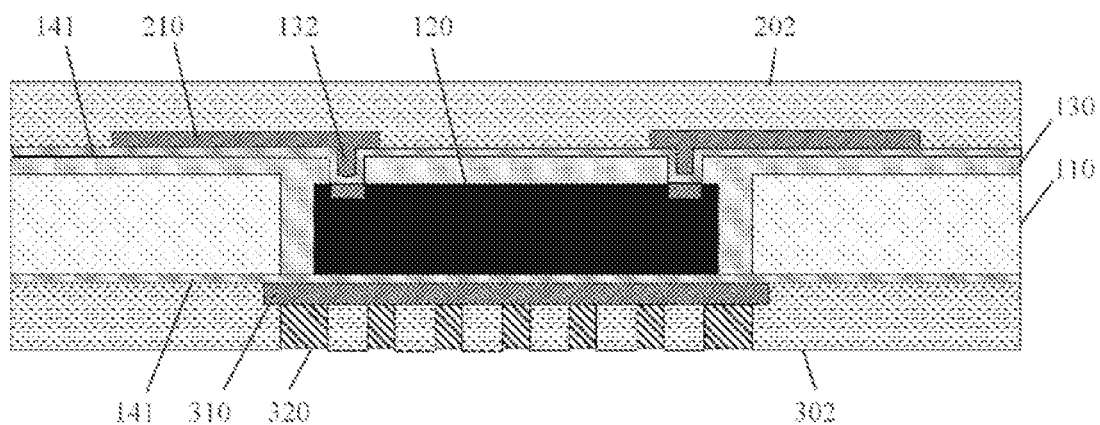
Figure 12:
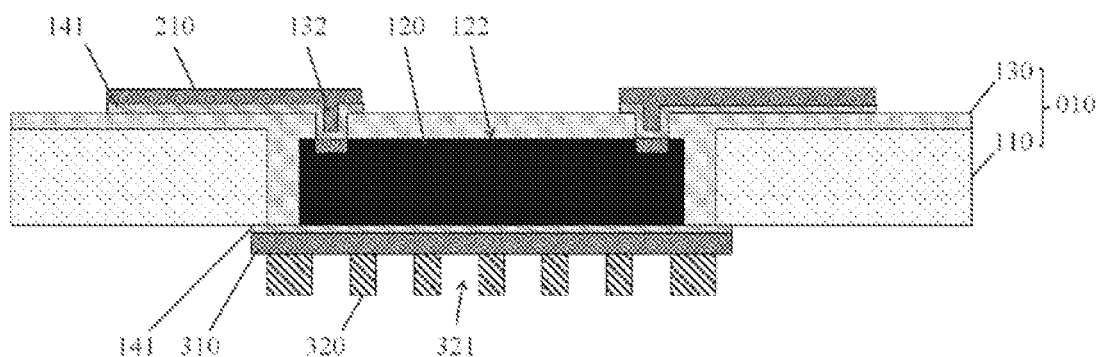

In step S360, with reference to FIG. 11 and FIG. 12, a second metal face 320 is machined on the first metal face 320, where the second metal face 320 is provided with a first cooling channel pattern 321 for forming a cooling channel 322. Similarly, the second metal face 320 may be obtained by machining using pattern transfer and pattern electroplating. For example, a third photoresist material 202 is applied on the first circuit layer 200, a fourth photoresist material 302 is applied on the second circuit layer 300, and the fourth photoresist material 302 is exposed and developed to obtain a corresponding circuit pattern. According different means of production, the first cooling channel pattern 321 may be patterns of different structures, such as a comb pattern or a serpentine pattern.

In the embodiment of the disclosure, the first metal face 310 and the second metal face 320 are machined on the heat dissipation face 121 of the chip 120, so that the cooling channel 322 is formed, thus being beneficial for improving heat dissipation performance. Moreover, the cooling channel 322 can be formed during machining of the packaging substrate, so that machining steps are simple, thus being beneficial for reducing production costs.

Figure 18:
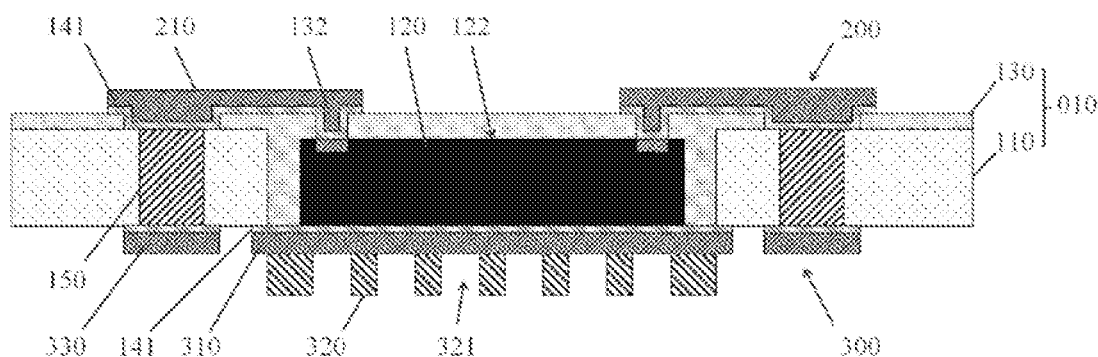

In practical application, a corresponding functional circuit may also be arranged in the first circuit layer 200 and the second circuit layer 300 respectively, and the functional circuits are used for signal transmission. In order to realize the signal transmission between the functional circuits of the first circuit layer 200 and the second circuit layer 300, the supporting frame 100 with an interlayer conductive structure may be used during manufacturing. For example, the supporting frame 100 shown in FIG. 13 to FIG. 18 is provided with a first through hole post 150 used as the interlayer conductive structure. The cyclic cooling embedded packaging substrate is obtained after machining by steps S310 to S360. With reference to FIG. 18, the second circuit layer 300 is further provided with a first functional circuit 330, a first end of the first through hole post 150 is connected with the first trace 210, and a second end of the first through hole post 150 is connected with the first functional circuit 330. In this way, a signal of the chip 120 may be transmitted along the first trace 210, the first through hole post 150 and the first functional circuit 330.

The manufacturing method above shows a machining example of a two-layer board, and the cyclic cooling embedded packaging substrate may also be continuously subjected to layer-addition based on the two-layer board in application, so as to obtain a multi-layer board. Therefore, the manufacturing method of a cyclic cooling embedded packaging substrate according to an embodiment further includes the following steps.

Figure 19:
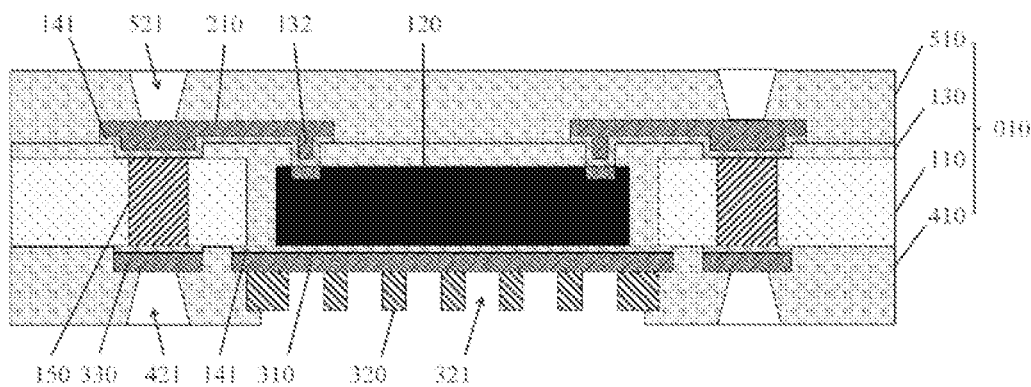

In step S371, with reference to FIG. 19, a second dielectric layer 410 is manufactured on the second face of the supporting frame 100, and a window is opened in a first region and a second region of the second dielectric layer 410 respectively, where the first region corresponds to the first cooling channel pattern 321, and the second region corresponds to at least one of the first through hole post 150 or the first functional circuit 330.

Specifically, the second dielectric layer 410 in the embodiment is made of a photosensitive insulating material, and arranged on the second face of the supporting frame 100 by pasting, coating or printing. A window is opened in the first region and the second region respectively by exposure and development, where the window in the first region is opened to expose the first cooling channel pattern 321, and the window in the second region is opened to form a second through hole 421. In addition, the second dielectric layer 410 may also be made of a dielectric material, such as a prepreg, and may be formed with windows by protective tape adhesion, lamination, uncovering, drilling and other procedures.

Figure 20:
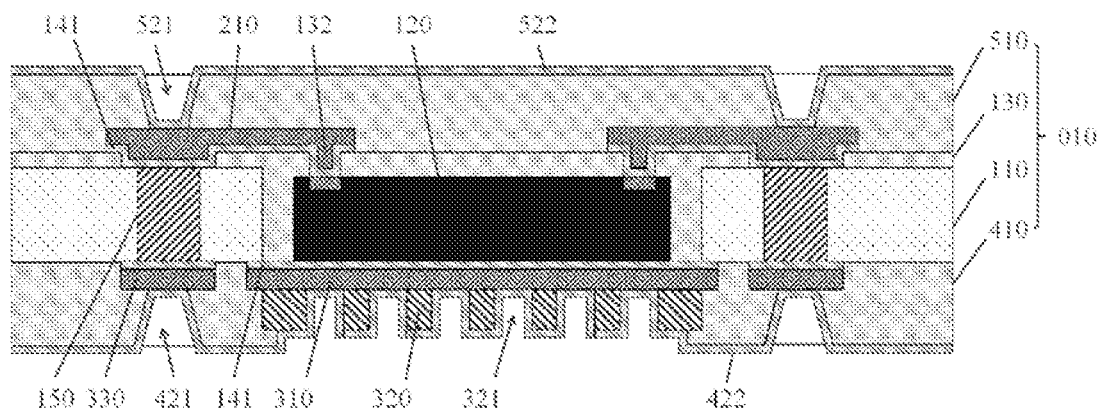
Figure 21:
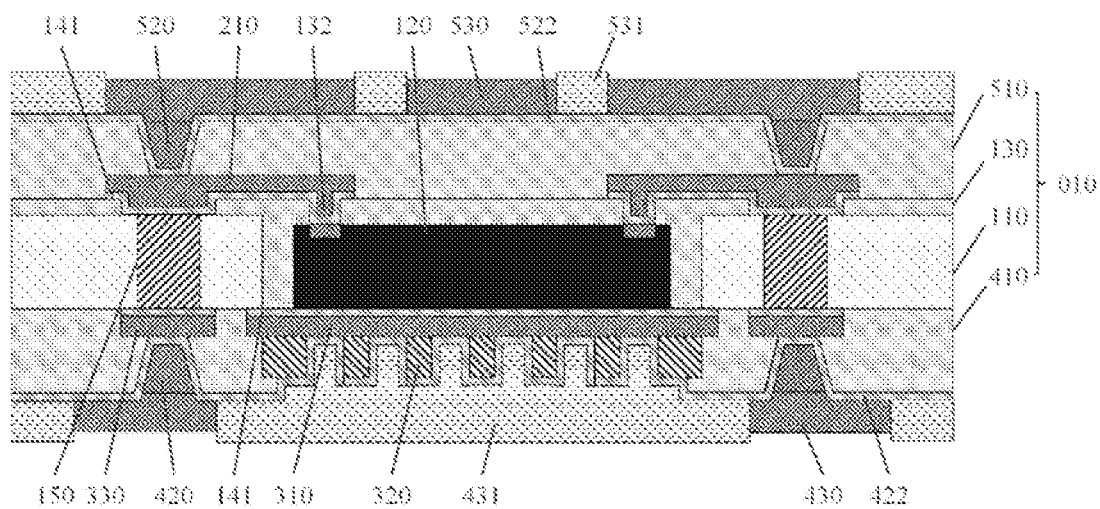

In step S372, with reference to FIG. 20 and FIG. 21, a first via hole 420 used as an interlayer conductive structure is machined in the second region.

Specifically, the second through hole 421 is formed by opening an window in step S371, and the second through hole 421 may be machined into the first via hole 420 by electroplating a metal. It is conceivable that, in order to improve a bonding force between the metal and the second dielectric layer 410, a second metal seed layer 422 may be machined on the second dielectric layer 410 in advance before electroplating the metal, and the second metal seed layer 422 is removed after finishing electroplating.

Figure 22:
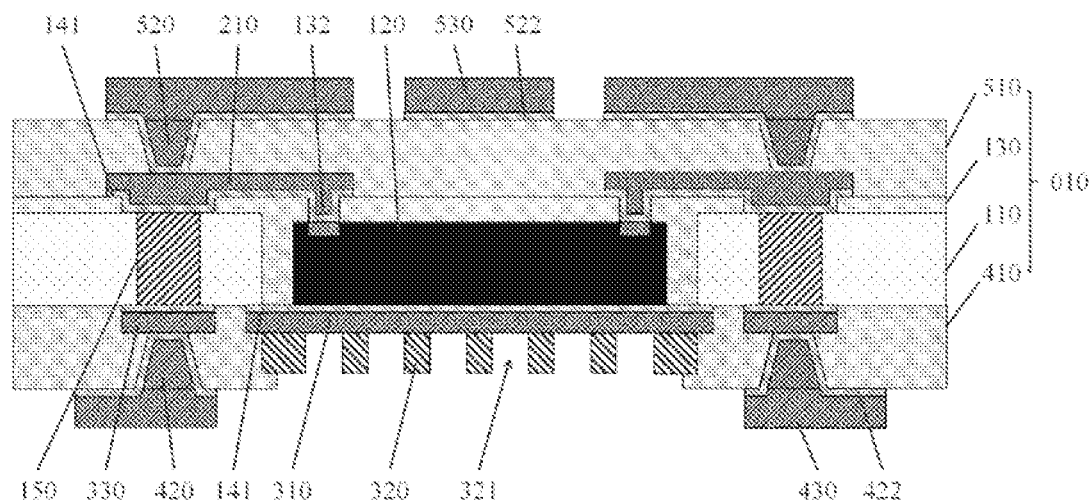

In step S373, with reference to FIG. 21 to FIG. 22, a second functional circuit 430 is machined on a surface of the second dielectric layer 410, and the second functional circuit 430 is connected with the first via hole 420.

Specifically, the second functional circuit 430 is machined by the same method as the first functional circuit 330, which means that a fifth photoresist material 431 is applied on the second dielectric layer 410, and the second functional circuit 430 is obtained by machining using pattern transfer and pattern electroplating, with a difference that according to different means of production, the second functional circuit 430 and the first functional circuit 330 may have different circuit patterns.

During production, in addition to performing layer-addition on the second face of the supporting frame 100, the first face of the supporting frame 100 may also be subjected to layer-addition. Therefore, the manufacturing method of a cyclic cooling embedded packaging substrate further includes the following steps.

In step S381, with reference to FIG. 18 and FIG. 19, a third dielectric layer 510 is manufactured on the first face of the supporting frame 100. Similar to the second dielectric layer 410, the third dielectric layer 510 may be made of a photosensitive insulating material or a dielectric material. It is conceivable that, the second dielectric layer 410 and the third dielectric layer 510 may be machined synchronously in the same procedure, thus being beneficial for saving procedures and production materials.

In step S382, with reference to FIG. 19 and FIG. 20, a second via hole 520 used as an interlayer conductive structure is machined on the third dielectric layer 510, and the second via hole 520 is connected with the first trace 210.

For example, when the third dielectric layer 510 is made of the photosensitive insulating material, the third through hole 521 is machined by exposure and development, and the third through hole 521 is machined into the second via hole 520 by electroplating a metal. For another example, when the third dielectric layer 510 is made of the dielectric material, the third through hole 521 may be machined by laser drilling, and the third through hole 521 is machined into the second via hole 520 by electroplating a metal. It is conceivable that, in order to improve a bonding force between the metal and the third dielectric layer 510, a third metal seed layer 522 may be machined on the third dielectric layer 510 in advance before electroplating the metal, and the third metal seed layer 522 is removed after finishing electroplating.

In step S383, with reference to FIG. 21 and FIG. 22, a third functional circuit 530 is machined on a surface of the third dielectric layer 510, and the third functional circuit 530 is connected with the second via hole 520. A sixth photoresist material 531 is applied on the third dielectric layer 510, and the third functional circuit 530 is obtained by machining using pattern transfer and pattern electroplating. The third functional circuit 530 and the second functional circuit 430 may be machined synchronously in the same procedure, thus being beneficial for saving procedures and production materials.

Figure 23:
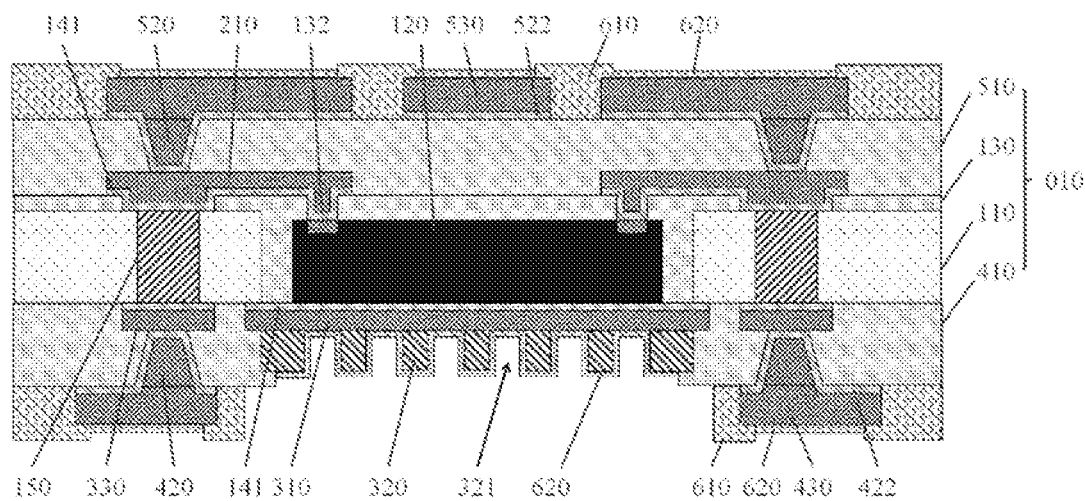

With reference to FIG. 23, in a multi-layer board structure, after an outer layer circuit is completely machined, resistance welding 610 and metal surface processing may be applied on the outer layer circuit. For example, assuming that the second functional circuit 430 is the outer layer circuit, a first resistance welding layer is manufactured on the second functional circuit 430. After the first resistance welding layer is completely manufactured, the manufacturing method of a cyclic cooling embedded packaging substrate according to an embodiment further includes the following steps.

In step S384, a first metal surface processing layer 620 is machined on the first cooling channel pattern 321. The first metal surface processing layer 620 may be antioxidation, electroless nickel electroless palladium immersion gold, tin plating or immersion silver, and the first metal surface processing layer 620 can improve oxidation resistance of the first metal face 310 and the second metal face 320.

When at least one of the second functional circuit 430 or the third functional circuit 530 is machined, the first metal surface processing layer 620 may cover the second functional circuit 430 or the third functional circuit 530 during machining.

In the manufacturing method illustrated above, the cooling channel 322 may be machined on the heat dissipation face 121 of the chip 120 through the first metal face 310 and the second metal face 320. According to different design requirements, a back cover may be applied on the cooling channel 322 to form a relatively closed cooling channel 322. In this way, a coolant may be pumped into the cooling channel 322 by an external hydraulic pump, which can quickly take away heat generated by the chip 120 during running, thus greatly improving heat dissipation performance.

Therefore, the manufacturing method of a cyclic cooling embedded packaging substrate according to an embodiment further includes the following steps.

Figure 24:

In step S391, with reference to FIG. 24, a metal base material 701 is provided, where the metal base material 701 may be a copper board.

Figure 25:
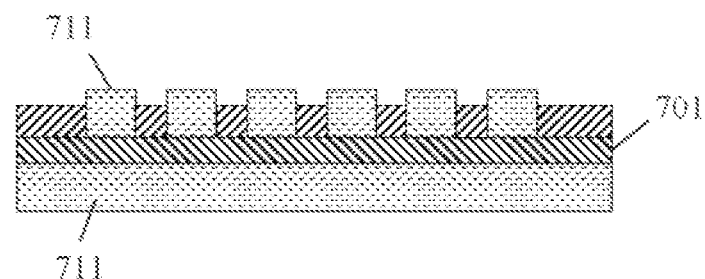

In step S392, with reference to FIG. 25, a second cooling channel pattern 702 is machined on the metal base material 701, where the second cooling channel pattern 702 is adapted to the first cooling channel pattern 321.

Figure 26:
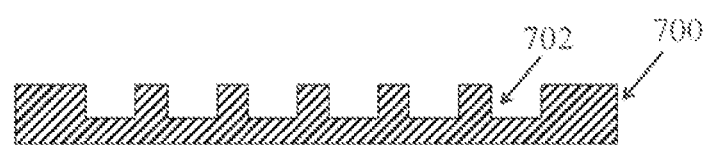
Figure 27:
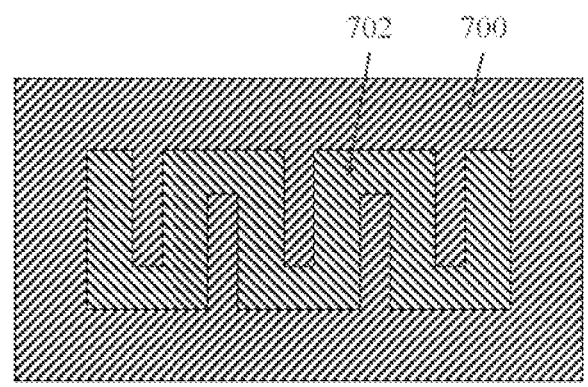

Specifically, a seventh photoresist material 711 is applied on the metal base material 701, and the second cooling channel pattern 702 is obtained by machining using pattern transfer and pattern electroplating. After the second cooling channel pattern 702 is completely machined, the seventh photoresist material 711 is removed. As shown in FIG. 26 and FIG. 27, a shape of the second cooling channel pattern 702 is the same as that of the first cooling channel pattern 321, and a thickness of the second cooling channel pattern 702 is equal to that of the first cooling channel pattern 321, or is increased or reduced as required, so that an inner space of the cooling channel 322 can be increased, and the thickness of the first cooling channel pattern 321 can be reduced to some extent to facilitate pattern electroplating.

Figure 29:

In step S393, with reference to FIG. 29, a first opening 720 used as an inlet of the cooling channel 322 and a second opening 730 used as an outlet of the cooling channel 322 are machined on the metal base material 701. The first opening 720 and the second opening 730 may be through holes or notch grooves, and the first opening 720 and the second opening 730 may be obtained by machining using mechanical drilling or laser drilling.

Figure 28:
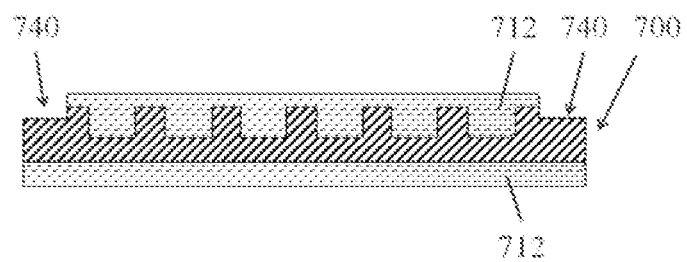

According to different means of production, before machining the first opening 720 and the second opening 730, the manufacturing method further includes the following step. With reference to FIG. 28 and FIG. 29, an avoidance recess 740 is machined on an edge of the metal base material 701. The avoidance recess 740 is configured for avoiding the material of the third dielectric layer 510 when the metal base material 701 is connected with the second metal face 320. Specifically, an eighth photoresist material 712 is applied on the metal base material 701, and the avoiding recess 740 is obtained by pattern etching.

In step S394, the metal base material 701 machined with the second cooling channel pattern 702 covers and is connected to the second metal face 320 to form a third metal face 700. A connected structure may refer to FIG. 3 and FIG. 4. The metal base material 701 may be connected with the first cooling channel pattern 321 through an adhesive material, and the adhesive material may be heat-conducting glue or silver paste.

In order to improve oxidation resistance of the metal base material 701 and the second cooling channel pattern 702, before step S394 in which the metal base material 701 machined with the second cooling channel pattern 702 covers and is connected to the second metal face 320, the manufacturing method further includes the following step.

Figure 30:
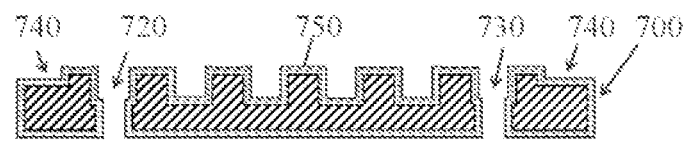

In step S395, with reference to FIG. 30, a second metal surface processing layer 750 is machined on the metal base material 701 and the second cooling channel pattern 702. The second metal surface processing layer 750 may be antioxidation, electroless nickel electroless palladium immersion gold, tin plating or immersion silver.

The embodiment of the disclosure further discloses a cyclic cooling embedded packaging substrate prepared by the manufacturing method of a cyclic cooling embedded packaging substrate above.

Example Embodiment 4

The embodiment of the disclosure discloses a manufacturing method of a cyclic cooling embedded packaging substrate, which includes the following steps.

Figure 13:
Figure 14:
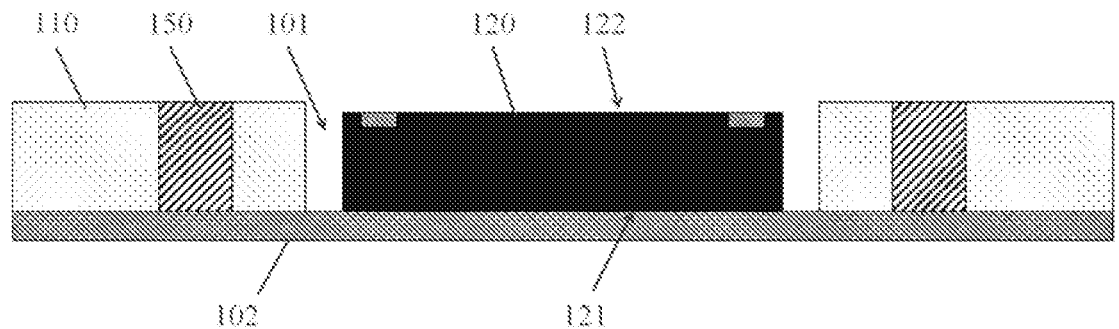
Figure 15:
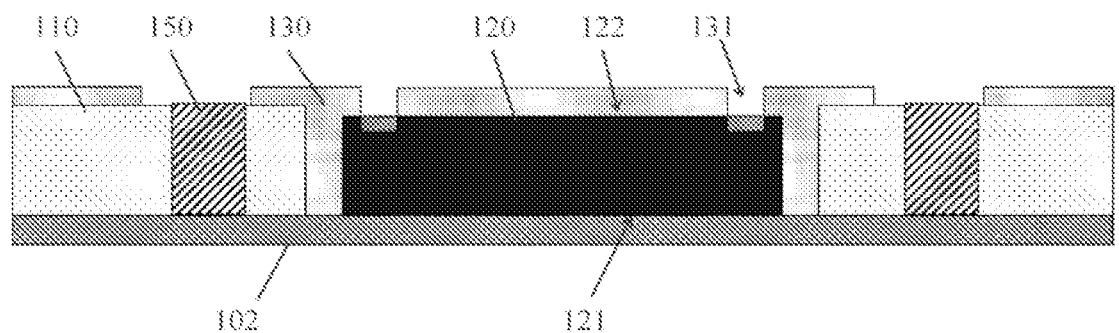
Figure 16:
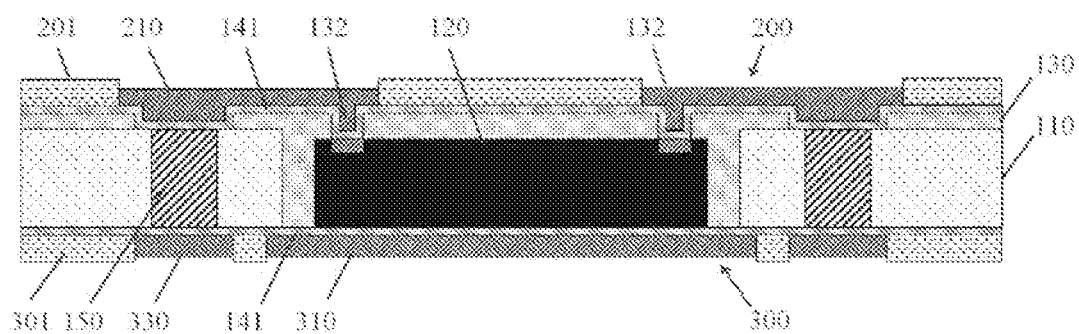
Figure 17:
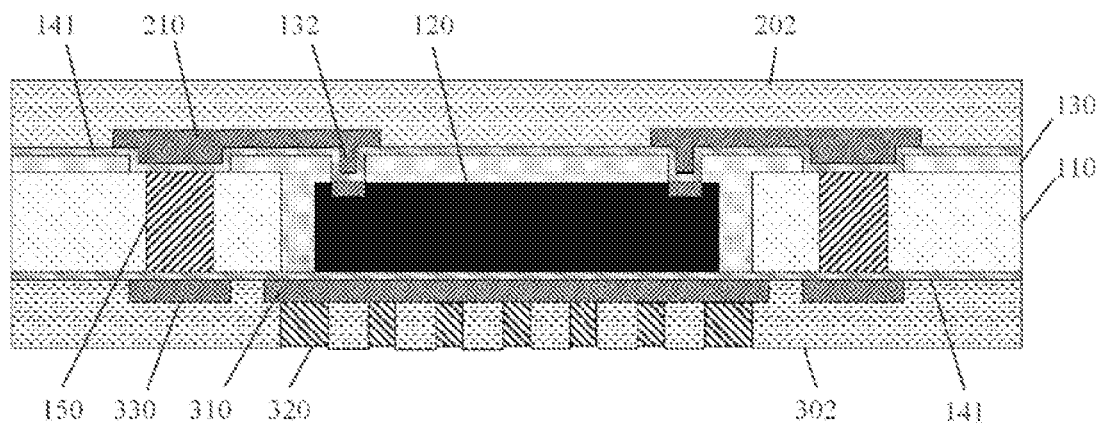

In step S410, with reference to FIG. 13, a supporting frame 100 used as a first dielectric layer 110 is provided, where the supporting frame 100 is provided with a packaging cavity 101, and provided with a first face and a second face which are opposite. The supporting frame 100 is made of a polymer material, and the polymer material may be FR4, an Ajinomoto Build-up material, polyimide, a prepreg containing a glass fabric, or a combination thereof. It is worth understanding that, one or more packaging cavities 101 may be provided, and for convenience of description, one packaging cavity 101 is taken as an example in the embodiment.

Figure 31:
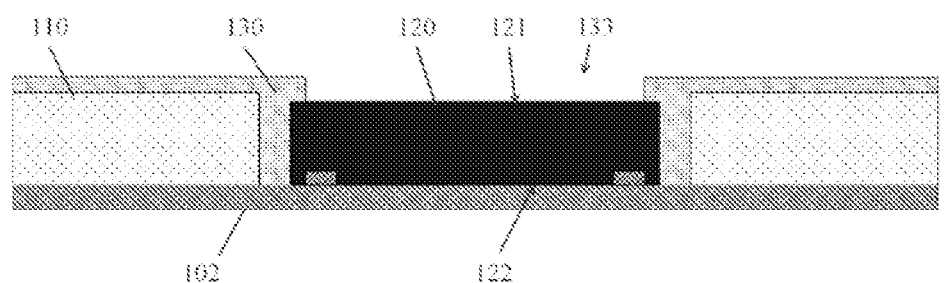
FIG. 31 to FIG. 33 are schematic structural diagrams of intermediate processes of a manufacturing method of a cyclic cooling embedded packaging substrate according to example Embodiment 4 of the disclosure.

In step S420, with reference to FIG. 31, a temporary bearing face 102 is arranged on a bottom portion of the packaging cavity 101, a to-be-packaged chip 120 is attached in the packaging cavity 101, and an active face 122 of the chip 120 is in contact connection with the temporary bearing face 102.

Specifically, since the packaging cavity 101 is an empty cavity penetrating through the first face and the second face of the supporting frame 100, it is necessary to adhere an adhesive tape, an adhesive paper or an adhesive plaster to the second face of the supporting frame 100 before attaching the chip 120, so as to achieve a purpose of providing the temporary bearing face 102 on the bottom portion of the packaging cavity 101. The chip 120 is attached in the packaging cavity 101, and the active face 122 of the chip 120 is in contact connection with the temporary bearing face 102, so that a pin on the active face 122 of the chip 120 may be flush with the second face of the supporting frame 100, thus being convenient for subsequent machining of the first trace 210.

In step S430, with reference to FIG. 31, after packaging the chip 120 with a packaging material 130, a first windowing position 133 is machined on the packaging material 130, and the first windowing position 133 corresponds to a heat dissipation face 121 of the chip 120. After the chip 120 is completely packaged, the heat dissipation face 121 of the chip 120 is embedded in the packaging material 130, so that it is necessary to expose the heat dissipation face 121 of the chip 120 through the first windowing position 133. In the embodiment, the packaging material 130 is a photosensitive material, and the first windowing position 133 is machined on the packaging material 130 by exposure and development. The packaging material 130 may also be a dielectric material (such as a prepreg), and the first windowing position 133 may be obtained by laser cutting.

Figure 32:
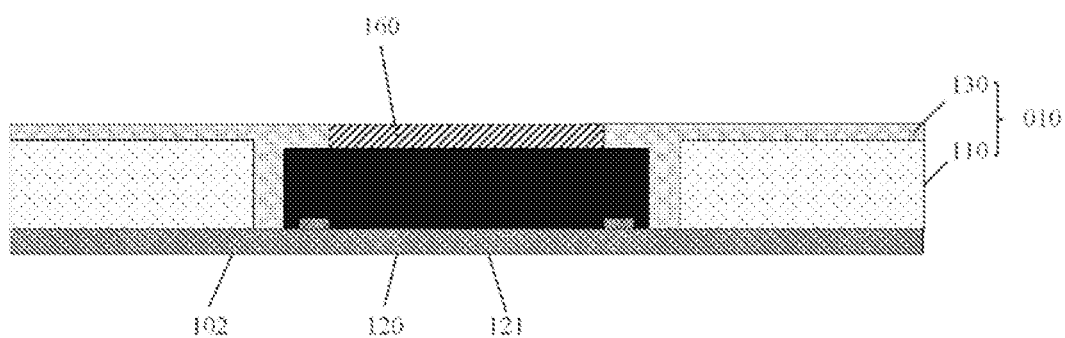

In step S440, with reference to FIG. 32, a heat conductive metal face 160 is machined in the first windowing position 133.

Specifically, the heat conductive metal face 160 may be obtained by machining using pattern transfer and pattern electroplating. In order to ensure that the heat conductive metal face 160 is flush with a surface of the packaging material 130, a surface of the heat conductive metal face 160 may also be flattened.

In step S450, the temporary bearing face 102 is removed for exposing a terminal on the active face 122 of the chip 120, thus being convenient for subsequent connection with the first trace 210.

Figure 33:
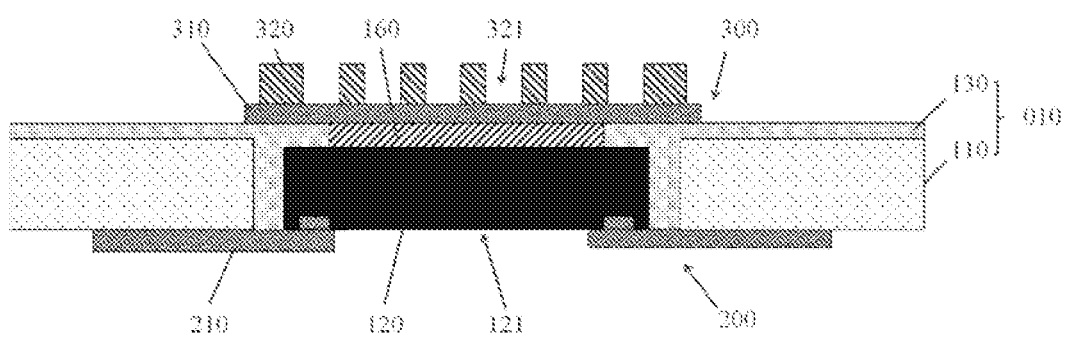

In step S460, with reference to FIG. 33, a first circuit layer 200 is machined on the second face of the supporting frame 100, and a second circuit layer 300 is machined on the first face of the supporting frame 100. The second circuit layer 300 is provided with a first metal face 310 which covers and is connected to the heat conductive metal face 160, the first circuit layer 200 is provided with the first trace 210, and the first trace 210 is connected to the corresponding terminal on the active face 122 of the chip 120.

Specifically, the first circuit layer 200 and the second circuit layer 300 may both be obtained by machining using pattern transfer and pattern electroplating. Since the terminal on the active face 122 of the chip 120 is exposed to the second face of the supporting frame 100, the first circuit layer 200 is machined on the supporting frame 100, so that the first trace 210 of the first circuit layer 200 is connected with the corresponding terminal on the active face 122 of the chip 120, which can save a first conductive structure compared with example Embodiment 3.

In step S470, with reference to FIG. 33, a second metal face 320 is machined on the first metal face 320, where the second metal face 320 is provided with a first cooling channel pattern 321 for forming a cooling channel 322.

According to an embodiment of the disclosure, the first metal face 310 and the second metal face 320 are machined on the heat dissipation face 121 of the chip 120, so that the cooling channel 322 is formed, thus being beneficial for improving heat dissipation performance. Moreover, the cooling channel 322 can be formed during machining of the packaging substrate, so that machining steps are simple, thus being beneficial for reducing production costs.

Similar to example Embodiment 3, layer-addition may be performed continuously based on a two-layer board in the embodiment, so as to obtain a multi-layer board. Therefore, with reference to FIG. 19 to FIG. 23, the manufacturing method of a cyclic cooling embedded packaging substrate according to an embodiment further includes the following steps.

In step S481, a second dielectric layer 410 is manufactured on the first face of the supporting frame 100, and a window is opened in a first region and a second region of the second dielectric layer 410 respectively, where the first region corresponds to the first cooling channel pattern 321, and the second region corresponds to at least one of a first through hole post 150 or a first functional circuit 330.

In step S482, a first via hole 420 used as an interlayer conductive structure is machined in the second region.

In step S483, a second functional circuit 430 is machined on a surface of the second dielectric layer 410, and the second functional circuit 430 is connected with the first via hole 420.

During production, in addition to performing layer-addition on the first face of the supporting frame 100, the second face of the supporting frame 100 may also be subjected to layer-addition. Therefore, the manufacturing method of a cyclic cooling embedded packaging substrate further includes the following steps.

In step S491, a third dielectric layer 510 is manufactured on the second face of the supporting frame 100. Similar to the second dielectric layer 410, the third dielectric layer 510 may be made of a photosensitive material or a dielectric material. It is conceivable that, the second dielectric layer 410 and the third dielectric layer 510 may be machined synchronously in the same procedure, thus being beneficial for saving procedures and production materials.

In step S492, a second via hole 520 used as an interlayer conductive structure is machined on the third dielectric layer 510, and the second via hole 520 is connected with the first trace 210.

In step S493, a third functional circuit 530 is machined on a surface of the third dielectric layer 510, and the third functional circuit 530 is connected with the second via hole 520. The third functional circuit 530 and the second functional circuit 430 may be machined synchronously in the same procedure, thus being beneficial for saving procedures and production materials.

In a multi-layer board structure, after an outer layer circuit is completely machined, resistance welding and metal surface processing may be applied on the outer layer circuit. For example, assuming that the second functional circuit 430 is the outer layer circuit, a first resistance welding layer is manufactured on the second functional circuit 430. After the first resistance welding layer is completely manufactured, the manufacturing method of a cyclic cooling embedded packaging substrate according to an embodiment further includes the following steps.

In step S494, a first metal surface processing layer 620 is machined on the first cooling channel pattern 321. The first metal surface processing layer 620 may be antioxidation, electroless nickel electroless palladium immersion gold, tin plating or immersion silver, and the first metal surface processing layer 620 can improve oxidation resistance of the first metal face 310 and the second metal face 320.

The manufacturing method of a cyclic cooling embedded packaging substrate according to an embodiment further includes the following steps.

In step S501, with reference to FIG. 24, a metal base material 701 is provided.

In step S502, with reference to FIG. 25 to FIG. 27, a second cooling channel pattern 702 is machined on the metal base material 701, where the second cooling channel pattern 702 is adapted to the first cooling channel pattern 321.

In step S503, with reference to FIG. 29, a first opening 720 used as an inlet of the cooling channel 322 and a second opening 730 used as an outlet of the cooling channel 322 are machined on the metal base material 701.

In step S504, the metal base material 701 machined with the second cooling channel pattern 702 covers and is connected to the first cooling channel pattern 321. A machined structure may refer to FIG. 6.

It is worth understanding that, technical effects not involved in this embodiment refer to example Embodiment 3 to avoid repeated description.

The embodiment of the disclosure further discloses a cyclic cooling embedded packaging substrate prepared by the manufacturing method of a cyclic cooling embedded packaging substrate above.

The embodiments of the disclosure are described in detail with reference to the drawings above, but the disclosure is not limited to the above embodiments, and various changes may also be made within the knowledge scope of those of ordinary skills in the art without departing from the purpose of the disclosure.

The invention claimed is:

1. A cyclic cooling embedded packaging substrate, comprising:
    a dielectric material body provided with a first dielectric layer and a second dielectric layer, wherein the second dielectric layer is provided with a packaging cavity;
    a chip provided with a heat dissipation face and an active face, wherein the chip is packaged in the packaging cavity;
    a first metal face arranged in the dielectric material body and embedded in the second dielectric layer, wherein the first metal face covers and is connected to the heat dissipation face of the chip;
    a second metal face arranged on a surface of the first metal face, wherein the second metal face is embedded in the second dielectric layer and the second metal face is exposed to the second dielectric layer, wherein the second metal face is provided with a first cooling channel pattern for forming a cooling channel; and
    a first trace arranged on a surface of the dielectric material body or arranged in the dielectric material body, wherein the first trace is connected with a corresponding terminal on the active face of the chip through a first conductive structure;
    a third metal face which is connected with the second metal face and covers the first cooling channel pattern, wherein the third metal face is provided with a first opening and a second opening communicated with the cooling channel, wherein the third metal face is provided with a second cooling channel pattern, and the second cooling channel pattern is adapted to the first cooling channel pattern.

2. The cyclic cooling embedded packaging substrate according to claim 1, wherein an interlayer conductive structure is arranged in the dielectric material body, and the first trace is connected with a second trace of an adjacent layer through the interlayer conductive structure.

3. The cyclic cooling embedded packaging substrate according to claim 1, wherein a surface of the second metal face is provided with a first metal surface processing layer.

4. The cyclic cooling embedded packaging substrate according to claim 1, wherein a surface of the third metal face is provided with a second metal surface processing layer.

5. The cyclic cooling embedded packaging substrate according to claim 1, further comprising:
    a heat conductive metal face connected between the first metal face and the heat dissipation face of the chip, wherein an area of the heat conductive metal face is less than or equal to an area of the first metal face.

6. The cyclic cooling embedded packaging substrate according to claim 5, wherein an interlayer conductive structure is arranged in the dielectric material body, and the first trace is connected with a second trace of an adjacent layer through the interlayer conductive structure.

7. The cyclic cooling embedded packaging substrate according to claim 5, further comprising a third metal face which is connected with the second metal face and covers the first cooling channel pattern, wherein the third metal face is provided with a first opening and a second opening communicated with the cooling channel.

8. The cyclic cooling embedded packaging substrate according to claim 7, wherein the third metal face is provided with a second cooling channel pattern, and the second cooling channel pattern is adapted to the first cooling channel pattern.

* * * * *